Figure 1A:
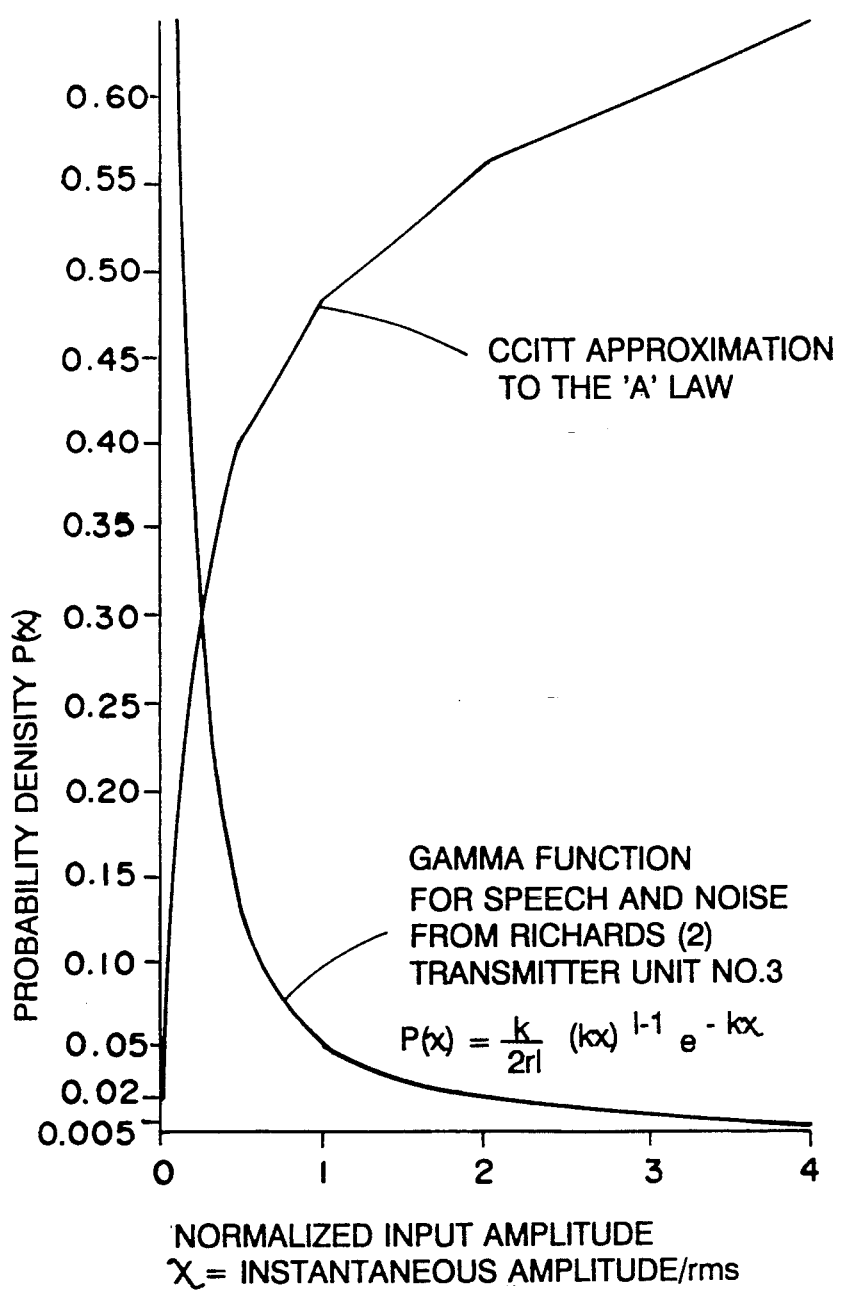

United States Patent [19]

Faulkner

[11] Patent Number: 5,062,152
[45] Date of Patent: Oct. 29, 1991

[54] PCM SIGNAL CODING

[75] Inventor: David W. Faulkner, Ipswich, England

[73] Assignee: British Telecommunications public limited company, Great Britain

[21] Appl. No.: 335,205

[22] PCT Filed: Jul. 20, 1988

[86] PCT No.: PCT/GB88/00590
§ 371 Date: Mar. 16, 1989
§ 102(e) Date: Mar. 16, 1989

[87] PCT Pub. No.: WO89/00790
PCT Pub. Date: Jan. 26, 1989

[30] Foreign Application Priority Data

Jul. 20, 1987 [GB] United Kingdom ............... 8717124

[51] Int. Cl.$^5$ ..................... G02F 1/00; H03M 5/00
[52] U.S. Cl. ..................... 359/185; 375/25; 341/56; 341/58; 341/59; 341/107
[58] Field of Search ............ 455/608, 609, 611; 375/25; 341/58, 59, 107, 63, 64, 56

[56] References Cited

U.S. PATENT DOCUMENTS

| | | | |
|---|---|---|---|
| 4,027,153 | 5/1977 | Kach | 250/350 |
| 4,430,670 | 2/1984 | Netravali | 375/26 |
| 4,528,550 | 7/1985 | Graves et al. | 341/56 |
| 4,562,426 | 12/1985 | Forney, Jr. | 341/51 |
| 4,667,337 | 5/1987 | Fletcher | 377/364 |
| 4,797,653 | 1/1989 | Takayama | 341/51 |

FOREIGN PATENT DOCUMENTS 0103248  3/1984  European Pat. Off. .

OTHER PUBLICATIONS

IBM Technical Disclosure Bulletin, vol. 28, No. 10, Mar. 1986, (New York, U.S.), "Group Encoding Method for Infrared Communication", pp. 4440–4441.
G. Held: "Data Compression, Techniques and Applications Hardware and Software Considerations", 12-1983, Wiley & Sons (Chichester, GB), p. 57.
IEEE Journal on Selected Areas in Communications, vol. SAC-4, No. 9, Dec. 1986, IEEE (New York, U.S.), P. R. Prucnal et al: "Ultrafast All-Optical Synchronous Multiple Access Fiber Networks", pp. 1484–1493.

Primary Examiner—Donnie L. Crosland
Attorney, Agent, or Firm—Nixon & Vanderhye

[57] ABSTRACT

A signal having a non-uniform probability density is processed for transmission in pulse code modulated form. The signal is quantized using conventional methods and the quantized signal is then coded using a non-sequential coding scheme in which binary codewords for the quantization levels are chosen in accordance with the probability of the quantization levels and number of ON bits in the codeword. Quantization levels of higher probability are assigned codewords with fewer ON bits. An optical network includes a central station having a master clock source. The central station is connected to a remote station including a signal processor arranged to process a signal for return transmission to the central station using minimum power codeword assignment.

11 Claims, 4 Drawing Sheets

FIG. 2

| TABLE 1 | PRIOR ART | EXEMPLARY EMBODIMENT OF INVENTION |
|---|---|---|
| QUANTIZATION LEVEL | CCITT (PRIOR ART) | MIN. POWER |
| 256 | 1111 1111 | 1111 1111 |
| 255 | 1111 1110 | 1111 1110 |
| 254 | 1111 1101 | 1111 1101 |
| 253 | 1111 1100 | 1111 1011 |
| 252 | 1111 1011 | 1111 0111 |
| 251 | 1111 1010 | 1111 1100 |
| ⋮ | ⋮ | ⋮ |
| 147 | 1001 0010 | 1110 0000 |
| 146 | 1001 0001 | 0001 1000 |
| 145 | 1001 0000 | 0011 0000 |
| 144 | 1000 1111 | 0100 0001 |
| 143 | 1000 1110 | 0100 0010 |
| 142 | 1000 1101 | 0100 0100 |
| 141 | 1000 1100 | 0100 1000 |
| 140 | 1000 1011 | 0101 0000 |
| 139 | 1000 1010 | 0110 0000 |
| 138 | 1000 1001 | 1000 0010 |
| 137 | 1000 1000 | 1000 0100 |
| 136 | 1000 0111 | 1000 1000 |
| 135 | 1000 0110 | 1001 0000 |
| 134 | 1000 0101 | 1010 0000 |
| 133 | 1000 0100 | 1100 0000 |
| 132 | 1000 0011 | 1000 0000 |
| 131 | 1000 0010 | 0100 0000 |
| 130 | 1000 0001 | 0010 0000 |
| 129 | 1000 0000 | 0001 0000 |
| 128 | 0000 0000 | 0000 0000 |
| 127 | 0000 0001 | 0000 0001 |
| 126 | 0000 0010 | 0000 0010 |
| 125 | 0000 0011 | 0000 0100 |
| 124 | 0000 0100 | 0000 1000 |
| 123 | 0000 0101 | 0000 0011 |
| 122 | 0000 0111 | 0000 0101 |
| 121 | 0000 1000 | 0000 1001 |
| 120 | 0000 1001 | 0001 0001 |
| 119 | 0000 1010 | 0010 0001 |
| 118 | 0000 1011 | 0100 0001 |
| 117 | 0000 1100 | 0000 0110 |
| 116 | 0000 1101 | 0000 1010 |
| 115 | 0000 1110 | 0001 0010 |
| 114 | 0000 1111 | 0010 0010 |
| 113 | 0001 0000 | 0100 0010 |
| 112 | 0001 0001 | 1000 0010 |
| 111 | 0001 0010 | 0000 1100 |
| 110 | 0001 0011 | 1000 0001 |
| 109 | 0001 0101 | 0000 0111 |
| ⋮ | ⋮ | ⋮ |
| 001 | 0111 1111 | 0111 1111 |

Row 129 marks POSITIVE INPUT LEVELS; row 128 marks NEGATIVE INPUT LEVELS.

PCM SIGNAL CODING

The present invention relates to Pulse Code Modulation. (PCM) transmission techniques. It is particularly concerned with the problem of minimising the demands such techniques put upon the transmitter in the context of a system such as a passive optical network used for telephony.

In standard forms of coding for Pulse Code Modulation, such as the coding scheme recommended by CCITT for telephony, an analogue signal is divided into a number of quantization levels (256 in the case of 8-bit coding) and each quantization level assigned a binary codeword. The quantization levels may be uniformly distributed over the amplitude range of the signal or alternatively a logarithmic distribution may be used. In either case the binary codewords are assigned sequentially to the quantization levels so that, for example, in the CCITT 8-bit coding scheme quantization levels 130, 131 and 132 are assigned binary codewords 1000 0001, 1000 00010 and 1000 0011. The first (i.e. most significant) bit of the codeword is used to denote the sign of the quantization level.

According to a first aspect of the present invention a method of processing a signal having a non-uniform probability density for transmission in pulse code modulated form comprises quantizing the signal and coding the quantized signal using a non-sequential coding scheme in which binary codewords for the quantization levels are chosen in accordance with the probability of the quantization levels and the number of ON bits in the codeword so that quantization levels of higher probability are assigned code words with fewer ON bits.

The present invention provides a coding scheme which minimises the power required to transmit signals such as speech or music which have non-uniform probability densities. The amplitude probability distribution of speech, for example, peaks around zero amplitude and decreases with increasing amplitude. Similarly after quantization the most probable quantization levels are those corresponding to the lowest amplitudes and the quantization levels corresponding to increasing amplitudes have decreasing probabilities. The codeword which consumes the least power is all zeros, 0000 0000 in 8-bit coding, and that which consumes the most power is all ones, 1111 1111. Since the most likely quantization level, i.e. zero for speech, will over a period of time occur most frequently it is allocated the codeword 0000 0000. The nearest eight levels are the next most likely and are therefore allocated codewords having just a single ON bit, i.e. words taken from the set 0000 0001, 0000 0010, 0000 0100, ... 1000 0000. Such a coding scheme by matching the codewords requiring least power to the most frequently occurring quantization levels effects a marked reduction in the time-averaged power required for transmission of the signal.

The advantages of using a method in accordance with the present invention are found to be particularly great for optical systems using sources such as semiconductor diode lasers. By enabling the transmitter in such a system to run cooler and place less demand on the power supply a significant increase in transmitter reliability is obtained. A further advantage is that with a method in accordance with the present invention near-end crosstalk levels are reduced. Intersymbol interference (ISI) is also reduced.

According to a second aspect of the present invention an optical network includes a central station having a master clock source and being connected to a remote station including signal processing means arranged to process a signal for return transmission to the central station by a method in accordance with the first aspect of the present invention.

Figure 1:
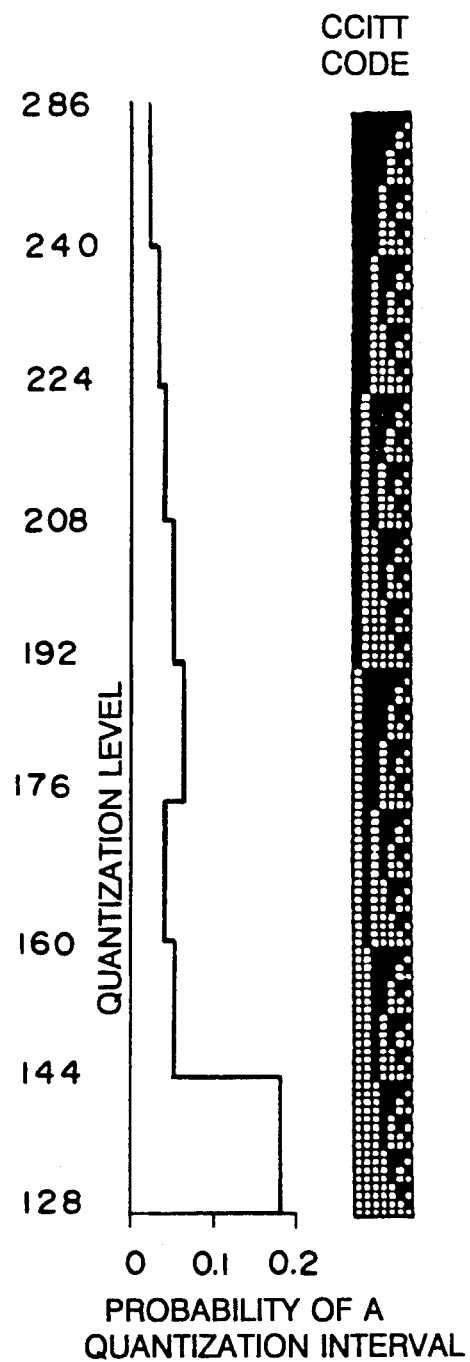
Figure 3:
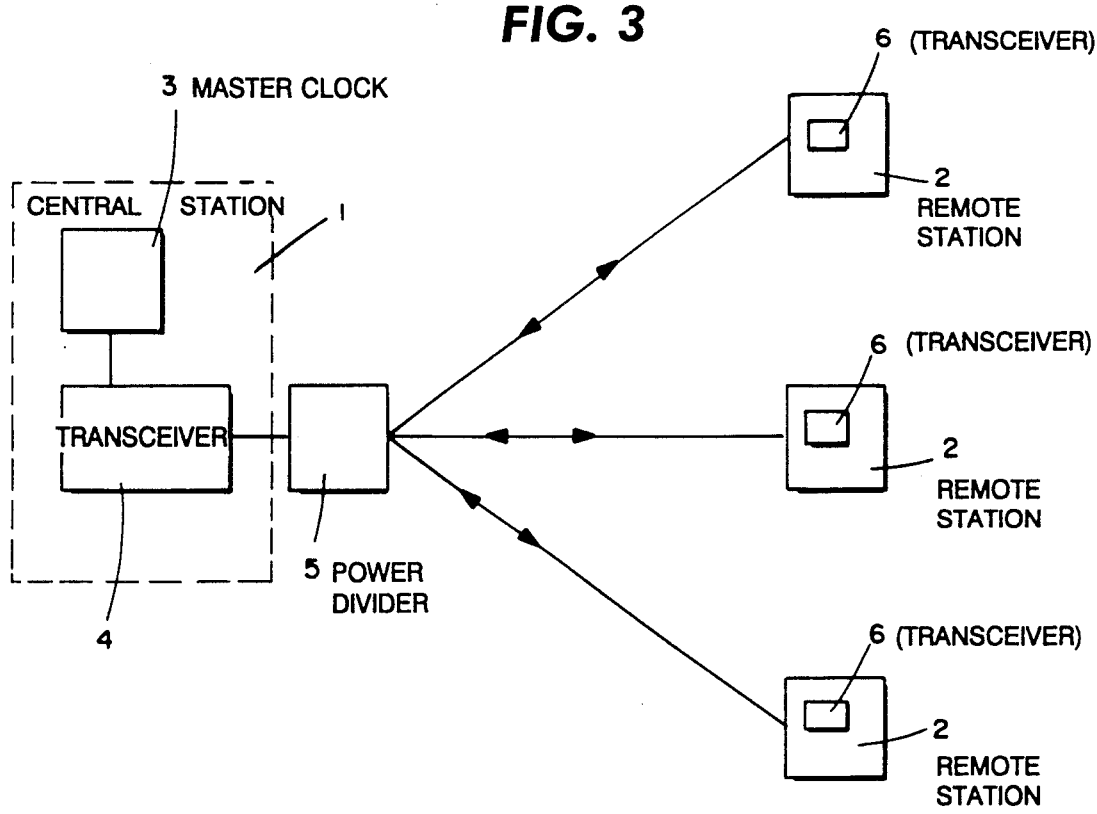

In transmission from the central station to a remote station without its own clock it is necessary to code the signal using a conventional line code which allows a synchronous clock to be recovered at the remote station. However for the return direction of transmission there is no need to re-transmit the clock since the master clock, with an appropriate phase shift, can be used to synchronise the regeneration of the signal received at the central station. Accordingly the processing of a signal for transmission along the return path to the central station is particularly appropriate for the use of a method in accordance with the first aspect of the present invention since the coding may be chosen simply to minimise the power requirements and there is no need for a conventional line code. Since a typical network will include many remote stations for each central station the advantages of a method which increases the reliability of the transmitters of the remote stations are particularly great. The present invention is now described in detail with reference to the accompanying drawing in which:

FIG. 1 are graphs illustrating probability distributions for signal amplitudes and the corresponding function for quantization levels;

FIG. 2 is a table listing a prior art coding scheme and a coding scheme in the accordance with the present invention; and, FIG. 3 is a diagram illustrating a network in accordance with the second aspect of the present invention. A signal such as speech or music having a non-uniform probability distribution is quantized using conventional methods and a binary codeword assigned to each quantization level. The codewords are transmitted in pulse code modulated forms using ON/OFF keying in a non-return-to-zero (NRZ) format.

In the preferred embodiment 8-bit codewords are used to code a total of 256 different quantization levels. The binary codewords are grouped into subsets according to the number of ON bits, i.e. ones rather than zeros, present. An 8-bit binary code set has 9 subsets, ranging from all zeros to all ones. The number of members of each subset as given by the permutation formula is shown in table 1 below where (1/8) denotes the subset of codewords having only one of the 8 bits equal to unity (2/8) denotes the subset of codewords having only two of the 8 bits equal to unity and so on.

TABLE 1

| SUBSET | NUMBER OF CODEWORDS |
|---|---|
| (0000 0000) | 1 |
| (1/8) | 8 |
| (2/8) | 28 |
| (3/8) | 56 |
| (4/8) | 70 |
| (5/8) | 56 |
| (6/8) | 28 |
| (7/8) | 8 |
| (1111 1111) | 1 |

The amplitude probability distribution of speech which is discussed in more detail below, is such that the most frequently occurring quantization level is zero.

The codeword requiring minimum power, 0000 0000 is therefore allocated to this level. The 8 codewords in the subset (1/8) are then assigned to the next most frequently occurring 8 quantization levels and so on up to the subset (1111 1111), the codeword requiring the greatest power which is assigned to the quantization level of lowest probability.

The 256 quantization levels may be uniformly distributed over the amplitude range of interest or, in the case of the A law companding commonly used for speech a logarithmic distribution may be used which matches more closely the sensitivity of the ear. The piecewise linear approximation to the A law as recommended by the CCITT is shown in FIG. 1 for input amplitudes in the range 0–1 V. A symmetrical function is used for negative input levels.

The amplitude probability distribution of speech is represented by a gamma function (also shown in FIG. 1,)

$$P(x) = (k/2\Gamma(l))(kx)^{l-1}e^{-kx}$$

where x is the instantaneous r.m.s. amplitude and l is a parameter and $k = [l(l+1)]^{\frac{1}{2}}$. This function which peaks around 0 and is small at high levels. is discussed in detail in the text "Telecommunications By Speech", author D L Richards, published by Butterworth. If uniform quantizing is used for speech then the probability distribution function (PDF) given in FIG. 1 would also represent the probability of any quantization interval occurring, and appropriate code allocations could readily be made. For the case of particular interest where companding is used the PDF for the various quantization intervals must be derived by considering the mapping of the gamma function through the piecewise linear approximation to the A law. For simplicity this mapping has also been performed graphically for each linear segment and the resultant histogram is shown in FIG. 1. This PDF also peaks at low input levels. There is a secondary maximum at input amplitudes around ±0.5 which could affect the optimum choice of codewords so that the allocations for uniform and companded quantizing would differ. However, since the peak is small and its position would vary for loud and quiet speakers, it may conveniently be neglected.

Since both uniform and companded quantizing give rise to PDFs which peak at low input amplitudes the codeword allocations range from the minimum power codes near zero through to the highest power codes (7/8) and (1111 1111) at the extremes.

The table of FIG. 2 shows one possible power minimising coding scheme employing symmetry for a selection of 256 quantizing levels. This is compared with the prior art CCITT recommendations for speech transmission. Gaps are left in the table to separate the subsets of numbers of ON bits per word. These subsets are divided between the positive and negative quantization levels which split at quantization levels 128/129. Dotted lines show where the table is incomplete.

When no speech is present at the input to the encoder, random noise will cause the quantizer to waver between levels 128 and 129, assuming the noise is at a low level. Under this condition it is advantageous to represent both levels by the codeword 0000 0000. This then prevents power being transmitted during, for example, the pauses while someone using a telephone system is listening to received speech. To avoid ambiguity at the decoder the same effect could be achieved by applying a DC offset equal to half a quantizing interval in the positive sense at the input to the encoder. There is then no ambiguity at the encoder output when no signal is present at the input.

An optical network employing the method of the present invention is shown diagramatically in FIG. 3. A time division multiple access (TDMA) network includes a central station 1 linked to remote stations 2. The central station includes a master clock 3, a transceiver 4 which includes an optical source such as a semi-conductor diode laser and signal processing means, and a passive power divider 5. Digital signals are transmitted from the central station 1 to the remote stations 2 using conventional line coding techniques. Each remote station extracts a clock from the incoming signal which it uses to synchronously demultiplex the channels it is to receive. In the return direction a time division multiplex is formed by interleaving data from each of the remote stations 2. For the return direction of transmission there is no need to retransmit the clock since the network is now synchronous. The tranceivers 6 of the remote stations 2 therefore include in addition to optical sources signal processing means arranged to operate in accordance with the method of the first aspect of this invention. The signal for return transmission is encoded using a power-minimising coding scheme and without a conventional line code. As a result the optical source in each remote station 2 runs cooler and places less demand upon the power supply. This method is found to increase significantly the reliability of the remote stations and so to enhance that of the network as a whole.

I claim:

1. A method of processing a pulse code modulated signal having a non-uniform probability density comprising:

quantising the signal as falling within one of plural predetermined signal levels, and coding the quantised signal by assigning codewords, each having plural binary-valued digits, to the quantisation levels in accordance with the occurrence probability of the quantisation levels and the number of ON bits in the codeword so that quantisation levels of higher occurrence probability are assigned codewords with fewer ON bits than those assigned to quantisation levels of lower occurrence probability.

2. A method according to claim 1, in which the probability density decreases with increasing amplitude and the one positive and one negative quantization levels of least amplitude are both assigned codewords having no ON Bits.

3. A method according to claim 1, in which the coded signal is transmitted using a semiconductor optical source.

4. An optical network including a central station having a master clock source and connected to a remote station including signal processing means arranged to process a signal for return transmission to the central station by a method in accordance with claim 1.

5. A method for encoding a level quantized signal having a non-uniform occurrence probability distribution using digital codewords which each have a predetermined number of binary-valued bits, one binary value representing an ON state of an energy pulse transmitting device and the other binary value representing an OFF state of said transmitting device, said method comprising the step of:

assigning said codewords to quantized signal levels so as to reduce the occurrence of ON state binary-valued bits.

6. A method for encoding a monotonic sequence of N quantized state values of a quantized signal using a monotonic occurrence of N fixed length multi-binary digit codewords, said method comprising the step of:

non-sequentially assigning said codewords to said sequence of quantized state values so as to reduce the occurrence probability of a predetermined binary value in the digits of assigned codewords as compared to such occurrences if monotonically sequential assignments had been effected.

7. A method for reducing the power required to transmit binary-valued bits of fixed length digital codewords used to represent a sequence of quantized signal states, said method comprising:

assigning codewords having relatively fewer bits of a predetermined first value to the quantized signal states most likely to occur, and transmitting said codewords using pulses of signal power to represent said bits of predetermined first value.

8. A method as in claim 7 wherein said assigning step includes assigning the same codeword having no bits of said predetermined first value to the two quantized signal states most likely to occur.

9. A method as in claim 7 wherein said transmitting step uses a semiconductor optical signal source which is switched ON to generate an optical signal pulse representing said bits of predetermined first value when they occur.

10. A method as in claim 7 wherein said steps of assigning and transmitting occur at each of remote stations in an optical signal network having a central station with master clock source in bi-directional optical signal communication with said remote stations.

11. An optical signal processing network comprising:

a central station with a master optical clock and a transceiver connected for optical signal communication with each of plural remote station transceivers;

at least some of said remote station transceivers including means for reducing the power required to transmit binary-valued bits of fixed length digital codewords used to represent a sequence of quantized signal states by assigning codewords having relatively fewer bits of a predetermined first value to the quantised signal states most likely to occur and using pulses of optical signal power to represent said bits of predetermined first value.

* * * * *